United States Patent [19]

Hamuro et al.

[11] Patent Number: 4,978,913

[45] Date of Patent: Dec. 18, 1990

[54] APPARATUS FOR MEASURING CHARACTERISTICS OF CHIP ELECTRONIC COMPONENTS

[75] Inventors: Mitsuroh Hamuro; Yoshitaka Hata; Shigeo Hayashi; Akihiko Takahashi, all of Kyoto, Japan

[73] Assignee: Murata Manufacturing Co., Ltd., Japan

[21] Appl. No.: 467,017

[22] Filed: Jan. 18, 1990

[30] Foreign Application Priority Data

| | | |
|---|---|---|
| Jan. 24, 1989 [JP] | Japan | 1-15834 |
| Jan. 24, 1989 [JP] | Japan | 1-15835 |
| Jan. 24, 1989 [JP] | Japan | 1-15836 |

[51] Int. Cl.$^5$ .......................... G01R 31/26; B07C 5/02
[52] U.S. Cl. .............. 324/158 F; 324/158 R; 209/573
[58] Field of Search ............... 324/158 F, 158 P, 73.1; 209/573, 574, 909, 910, 575; 414/798

[56] References Cited

U.S. PATENT DOCUMENTS

| | | | |
|---|---|---|---|
| 3,094,212 | 6/1963 | Moore et al. | 209/573 |
| 4,128,174 | 12/1978 | Frisbie et al. | 209/573 |
| 4,179,032 | 12/1979 | Artz et al. | 209/575 |
| 4,376,485 | 3/1983 | Shah | 209/575 |
| 4,436,619 | 3/1984 | Petrov et al. | 324/158 F |
| 4,500,003 | 2/1985 | Cedrone | 209/573 |

*Primary Examiner*—Reinhard J. Eisenzopf
*Assistant Examiner*—Vinh P. Nguyen
*Attorney, Agent, or Firm*—Ostrolenk, Faber, Gerb & Soffen

[57] ABSTRACT

Fixed terminals and movable terminals are arranged on both sides of a turn table, which is provided along its circumferential direction with a plurality of holding holes for receiving chip electronic components so that both end portions thereof project from the holding holes. The movable terminals are provided by parts of a printed circuit board or elastically flexible plate members such as plate springs, and they are elastically brought into contact with electrodes which are formed on first end surfaces of the chip electronic components. Due to such elastic contact of the movable terminals, electrodes formed on the other end surfaces of the chip electronic components are pressed into contact with the fixed terminals.

11 Claims, 7 Drawing Sheets

APPARATUS FOR MEASURING CHARACTERISTICS OF CHIP ELECTRONIC COMPONENTS

BACKGROUND OF THE INVENTION

1. Field of the Invention

The present invention relates to an apparatus for automatically measuring electric characteristics of chip electronic components each having electrodes on both end surfaces.

2. Description of the Background Art

Chip electronic components such as chip capacitors, chip resistors and the like are widely used due to advantages such as miniaturization, increase in mounting density, high reliability, suitability for automatic mounting, and the like. In order to mount such chip electronic components on substrates, it is necessary to previously measure electric characteristics thereof for the purpose of quality inspection. FIG. 11 shows a conventional characteristic measuring apparatus.

Referring to FIG. 11, a turn table 50 is provided with a large number of stepped holding holes 52 at constant pitches for holding chip electronic components 51, while fixed terminals 53 and movable terminals 54 are arranged closely on both sides of the turn table 50. The fixed and movable terminals 53 and 54 are provided in plural respectively at the same pitches as the holding holes 52 of the turn table 50. The movable terminals 54 are formed of pin terminals slidably supported by a slider 55, which is movable along a direction for being close to and separated from the turn table 50, and urged by springs 56 to project toward the turn table 50. The movable terminals 54 are provided on first end portions thereof with small-diameter shaft portions 54a, which can be inserted in small-diameter portions 52a of the holding holes 52 provided in the turn table 50. The second end portions of the movable terminals 54 are connected with measuring devices (not shown) through wires 57, while the fixed terminals 53 are also connected with the measuring devices.

In order to measure the characteristics of each chip electronic component 51, the slider 55 is leftwardly moved in FIG. 11 to insert the shaft portion 54a of the movable terminal 54 in the holding hole 52, thereby bringing the same into pressure contact with an end surface of the chip electronic component 51. The movable terminal 54 presses the chip electronic component 51 to bring the other end surface thereof into contact with the fixed terminal 53, thereby electrically connecting the chip electronic component 51 with the measuring devices for measuring the characteristics. When measurement of the characteristics is completed, the slider 55 is rightwardly moved in FIG. 11 to separate the movable terminal 54 from the chip electronic component 51, while the turn table 50 is rotated along the arrow by one pitch to measure the characteristics of the next chip electronic component through an operation similar to the above.

In the aforementioned characteristic measuring apparatus, it is necessary to mount components such as the springs 56 on the movable terminals 54, which are formed of pin terminals. Thus, the number of components is increased which will inevitably widen the terminal-to-terminal pitch P. Particularly when a large number of movable terminals 54 are arcuately arranged in order to simultaneously measure the characteristics of a large number of chip electronic components 51, the number of simultaneously measurable chip electronic components 51 is restricted and this reduces the measuring capability of the apparatus. Further, the holding holes 52 must be stepped to prevent falling of the chip electronic components 51 upon separation from the movable terminals 54, while the movable terminals 54 must be provided with the shaft portions 54a which are inserted in the small-diameter portions 52a of the holding holes 52. In particular, such holding holes 52 and small-diameter portions 52a are reduced in size with miniaturization of the chip electronic components 51, to cause difficulty in the machine work for obtaining the shaft portions 54a. The shaft portions 54a may damage the chip electronic components 51 since the same are brought into pressure contact with the end surfaces of the chip electronic components 51 in small areas. Further, the movable terminals 54 require excessively long strokes for passing through the small-diameter portions 52a of the holding holes 52, and this retards the speed of measurement.

SUMMARY OF THE INVENTION

Accordingly, an object of the present invention is to provide an apparatus for measuring characteristics of chip electronic components, which can solve the aforementioned problems.

The present invention is directed to an apparatus for measuring electric characteristics of chip electronic components having first and second electrodes which are formed on first and second opposite end surfaces respectively. In particular, the feature of the present invention resides in the structure of measuring terminals which are brought into contact with the first and second electrodes of the chip electronic components respectively.

The inventive characteristic measuring apparatus first comprises a movable holding member which is provided with a plurality of holding holes arranged at constant pitches for receiving chip electronic components through said holes, so that first and second end portions, including first and second end surfaces, of the chip electronic components project therefrom respectively, and is movable along the direction of arrangement of the holding holes. A plurality of fixed terminals, which can be brought into contact with the first end surfaces of the chip electronic components received in the holding holes of the movable holding member, are planarly arranged in correspondence to the holding holes. A plurality, of movable terminals are arranged oppose to the fixed terminals and are separated therefrom by the movable holding member. The movable terminals, which are provided by at least parts of an elastically flexible plate member, can be elastically brought into contact with the second end surfaces of the chip electronic components received in the holding holes.

According to the present invention, the movable terminals, which are formed from the elastically flexible plate member, can be brought into pressure contact with the end surfaces of the chip electronic components by spring force of the plate member itself. Therefore, it is not necessary to separately provide springs which have been required in the prior art, and hence the apparatus can be miniaturized with a small number of elements, while the arrangement pitch for the movable terminals can be reduced. Thus, it is possible to simultaneously measure the characteristics of a large number of chip electronic components, thereby improving the capabilities of the measurement apparatus.

The movable terminals can be brought into surface contact with the end surfaces of the chip electronic components. Thus, the chip electronic components are exposed to merely slight impact when the same are brought into contact with the movable terminals, and prevented from damage.

When the movable terminals are arranged to be close to each other, the chip electronic components will not fall from the holding holes. Thus, the holding holes provided in the movable holding member may not be stepped but may simply be prepared as through holes. In other words, the holding holes of the movable holding member may simply hold the chip electronic components to expose both end surfaces thereof. Thus, the movable terminals can be reduced in the length of their movement stroke as compared with the prior art, thereby improving the speed of measurement.

Preferably the movable terminals are prepared from a plate member, which is provided with a plurality of terminal parts arranged at constant pitches and slits formed between the terminal parts, by portions held between the slits.

In another preferred embodiment of the present invention, the movable terminals are formed of plate springs, whose first ends are fixed to a plate member. In this case, it is easy to replace only the movable terminals when the same are abraded.

In each of the aforementioned preferred embodiments of the present invention, the plate member may be formed of a printed circuit board, so that a large number of wires can be efficiently arranged while improving reliability thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
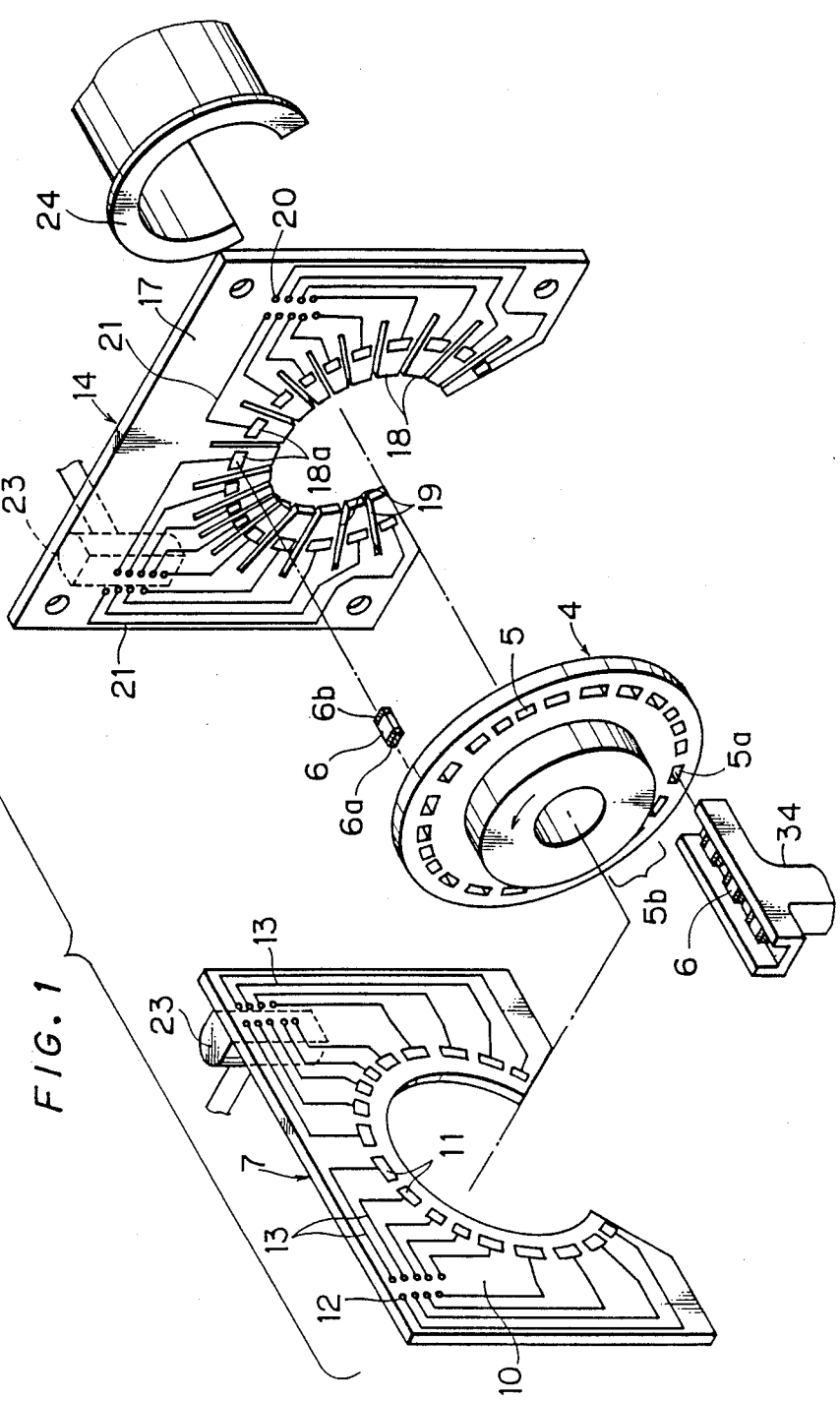
FIG. 1 is an exploded perspective view showing a principal part of a characteristic measuring apparatus according to the first embodiment of the present invention.
Figure 2:
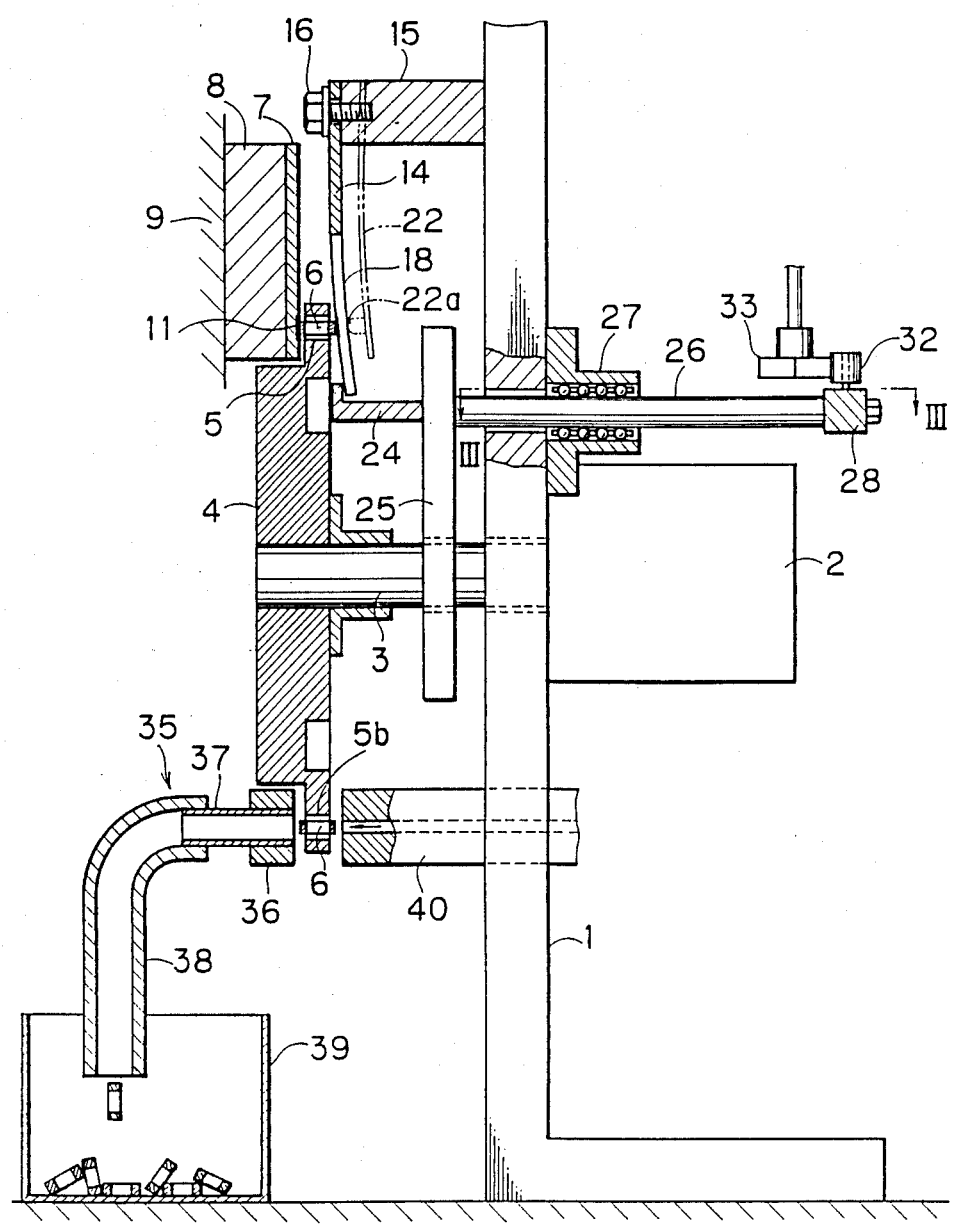
FIG. 2 is a partially fragmented side sectional view of the characteristic measuring apparatus shown in FIG. 1.
Figure 3:
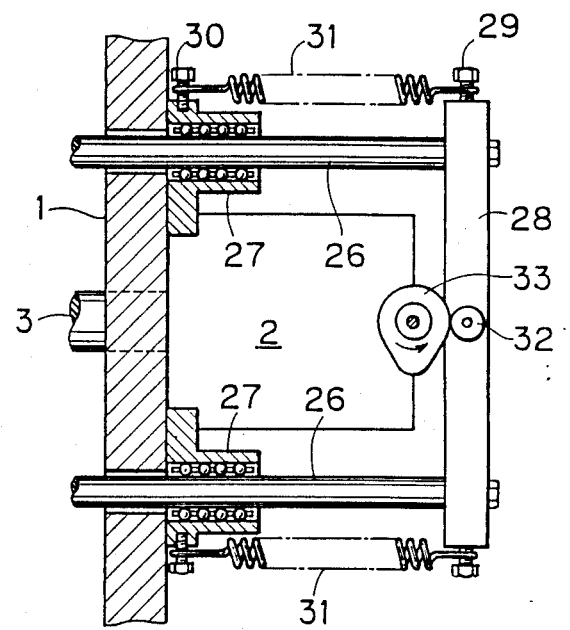
FIG. 3 is a sectional view taken along the line III—III in FIG. 2.

FIGS. 1 to 3 show the first embodiment of a characteristic measuring apparatus according to the present invention.

A motor 2, which is capable of intermittent operation every constant angle of rotation, is fixed to a support 1, and a disk-type turn table 4, which is made of an insulating material, is fixed to the forward end of a rotary shaft 3 of the motor 2. The turn table 4 is provided along its outer peripheral portion with a plurality of holding holes 5, which are arcuately arranged at constant pitches. These holding holes 5 are formed as through holes passing through the front and rear surfaces of the turn table 4. The holding holes 5 receive respective chip electronic components 6, so that electrodes 6a and 6b formed on both end portions, including end surfaces, of the chip electronic components 6 project from the holding holes 5.

A fixed printed circuit board 7 is arranged on one side of the turn table 4, and fixed to a fixed stand 9 through a spacer 8. As shown in FIG. 1, the fixed printed circuit board 7 comprises an insulating substrate 10 of glass epoxy resin or the like, which is provided on its surface with a plurality of fixed terminals 11 arcuately arranged in correspondence to the holding holes 5 and pattern wires 13 connecting the terminals 11 with through holes 12 for external connection.

A movable printed circuit board 14 is arranged on the other side of the turn table 4. The peripheral edge portions of the printed circuit board 14 are fixed to a spacer 15, which is fixed to the support 1, by bolts 16. Similarly to the fixed printed circuit board 7, the movable printed circuit board 14 comprises an insulating substrate 17 of glass epoxy resin or the like, which is provided on its surface with a plurality of terminal parts 18a arcuately arranged in correspondence to the holding holes 5 and pattern wires 21 connecting the terminal parts 18 with through holes 20 for external connection. Slits 19 are provided between the terminal parts 18a radially from the inner peripheral portion, thereby defining plate-spring type movable terminals 18, including the terminal parts 18a, integrally with the printed circuit board 14. The terminal parts 18a can be brought into pressure contact with the electrodes 6b of the chip electronic components 6 which are held in the holding holes 5 of the turn table 4 by spring force of the movable terminals 18, so that the other electrodes 6a of the chip electronic components 6 are pressed against the fixed terminals 11 by the contact pressure.

If the movable terminals 18 are insufficient in spring force, a reinforcing spring member 22 may be fixed to the spacer 15 to support the back portions of the movable terminals 18 by projections 22a provided on the forward end portion of the spring member 22.

Figure 4:
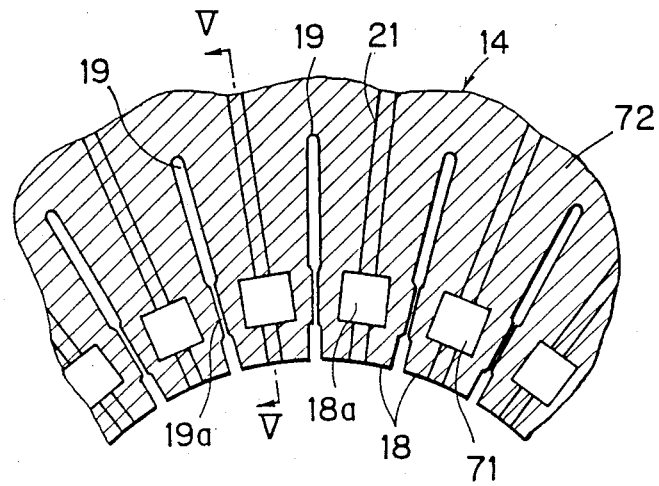
FIG. 4 is an enlarged front elevational view showing movable terminals 18 which are formed on a movable printed circuit board 14 shown in FIG. 1.
Figure 5:
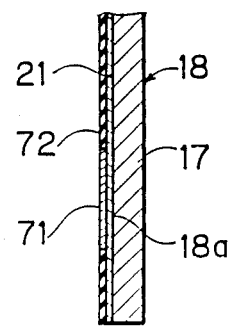
FIG. 5 is a sectional view taken along the line V - V in FIG. 4.

FIGS. 4 and 5 show the concrete structure of the movable terminals 18. The pattern wires 21 are formed by performing photo etching on a copper plate which is fixed to the overall surface of the insulating substrate 17. Each terminal part 18a is plated at a portion 71 with a conductive metal such as nickel and coated with a resist film 72 at portions excluding the conductive metal plating film 71 as shown in slanting lines in FIG. 4. In particular, the resist film 72 is made flush with the conductive metal plating film 71 on the terminal part 18a, to prevent the chip electronic component 6 and the conductive metal plating film 71 from being worn if sliding movement occurs of the chip electronic component 6 on the movable terminal 18. Further, each slit 19 is not constant in width but provided with a narrow portion 19a at the locus of movement of the chip electronic component 6. In more concrete terms, the narrow portion 19a of the slit 19 is worked with a laser, while the remaining portion is worked with a drill. The narrow portion 19a of the slit 19 is formed at the locus of movement of the chip electronic component 6, in order to prevent the chip electronic component 6 from engagement with the slit 19 or falling from the turn table 4.

Referring again to FIG. 1, the through holes 12 and 20 provided on the fixed printed circuit board 7 and the movable printed circuit board 14 respectively can be connected with connectors 23, which are connected with input/output parts of a plurality of types of measuring devices (not shown). In other words, opposite pairs of the fixed and movable terminals 11 and 18 are connected with the measuring devices respectively, so that various characteristics can be measured as to every chip electronic component 6 by rotating the turn table 4 pitch by pitch. The respective terminals serve as electrostatic capacitance measuring terminals, voltage applying terminals, insulation resistance measuring terminals or the like, for example.

A hook 24, which is C-shaped in a front view as shown in FIG. 1, engages with inner peripheral end portions of the movable terminals 18 as shown in FIG. 2. This hook 24 is coupled with two slide shafts 26 through a hook mounting plate 25. The slide shafts 26 are horizontally movably guided by slide bearings 27, which are mounted on the support 1, while rear end portions of the slide shafts 26 are coupled with each other by a stay 28, as shown in FIG. 3. Tension springs 31 extend between bolts 29 which are fixed to both end portions of the stay 28 and bolts 30 which are fixed to the slide bearings 27. A cam follower 32 is rotatably mounted on the central portion of the stay 28, to be in contact with a cam 33 through spring force of the tension springs 31.

When the cam 33 is so rotated as to rearwardly move the stay 28 against the tension springs 31, the hook 24 is also rearwardly moved with the stay 28. Thus, the movable terminals 18 are distorted and separated from the end surfaces of the chip electronic components 6, whereby the turn table 4 can be easily rotated in this state. At this time, the chip electronic components 6 will not enter the clearances between the movable terminals 18, which merely correspond to the slits 19. Further, the chip electronic components 6 will not fall from the holding holes 5 since the hook 24 has only a slight movement stroke. When the cam 33 is further rotated to forwardly move the stay 28, the hook 24 is leftwardly moved in FIG. 2 by the tension springs 31, to bring the movable terminals 18 into contact with the chip electronic components 6 during this stroke. The contact positions between the chip electronic components 6 and the movable and fixed terminals 18 and 11 are thus sequentially changed to enable measurement of various types of characteristics.

Coordinated with the rotation of the turn table 4, a chip electronic component feeder 34 supplies every chip electronic component 6 to a holding, hole 5a which is currently located at the lowermost part of the turn table 4, as shown in FIG. 1. Also coordinated with such rotation of the turn table 4, a selection mechanism 35 is arranged with respect to a plurality of (e.g., six) holding holes 5b succeeding the holding hole 5a, in order to select and discharge the chip electronic components 6. As shown in FIG. 2, the selection mechanism 35 comprises arcuate mounting frames 36 which are closely arranged along the holding holes 5 of the turn table 4, a plurality of discharge pipes 37 which are inserted in and fixed to the mounting frames 36, and tubes 38 which are connected with the discharge pipes 37, and the forward ends of the tubes 38 are inserted in separate storage boxes 39. On the other hand, a plurality of nozzles 40 are provided in the vicinity of the other side of the turn table 4, to oppose to the discharge pipes 37. The nozzles 40 draw in or blow out air. The chip electronic components 6 are selected in response to the characteristics thereof and, if necessary, discharged into the separate storage boxes 39. In order to discharge a chip electronic component 6 which is held in a prescribed holding hole 5 of the turn table 4 into a certain storage box 39, for example, air may be blown out from a nozzle 40 which is located in the corresponding position, thereby discharging the chip electronic component 5 from the discharge pipe 37 into the storage box 39 through the corresponding tube 38. When it is not necessary to discharge the chip electronic components 6 held in the holding holes 5 into the storage boxes 39, on the other hand, air may be sucked by the nozzles 40 corresponding to the holding holes 5, so that the chip electronic components 6 are not erroneously discharged in the storage boxes 39.

According to this embodiment, the inner end portions of the movable terminals 18 are distorted by the hook 24 to be in contact with/separated from the chip electronic components 6. Thus, the wires 21, the connectors 23 and the like remain unmoved even if the movable terminals 18 are displaced, whereby stable measurement can be made with only slight changes in stray capacitance and impedance.

Figure 6:
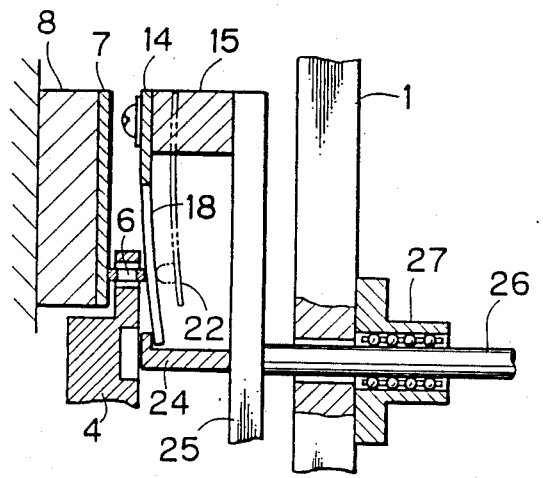
FIG. 6 is a side elevational view showing a principal part of the second embodiment of the present invention.

FIG. 6 shows the second embodiment of the present invention. Referring to FIG. 6, parts corresponding to those shown in FIG. 2 are denoted by the same reference numerals, and redundant description is omitted.

The embodiment shown in FIG. 6 is adapted to move the overall printed circuit board 14 in order to approach/separate chip electronic components 6 to/from movable terminals 18. In this case, not only a hook 24 but the printed circuit board 14, which is provided with the movable terminals 18, is fixed to a hook mounting plate 25, so that the hook 24 retains inner peripheral end portions of the movable terminals 18 in slightly distorted states Also in this case, a plate spring 22 may be provided at the back of the movable terminals 18 if necessary, in order to compensate for insufficient elasticity of the printed circuit board 14. It is noted that the hook 24 is not requisite in this embodiment.

According to the second embodiment, the movable terminals 18 can be improved in durability since the amount of distortion can be reduced as compared with the first embodiment.

Figure 7:
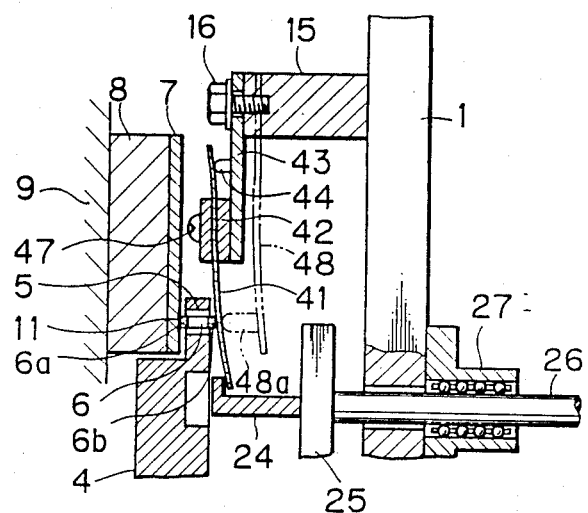
FIG. 7 is a side elevational view showing a principal part of the third embodiment of the present invention.
Figure 8:
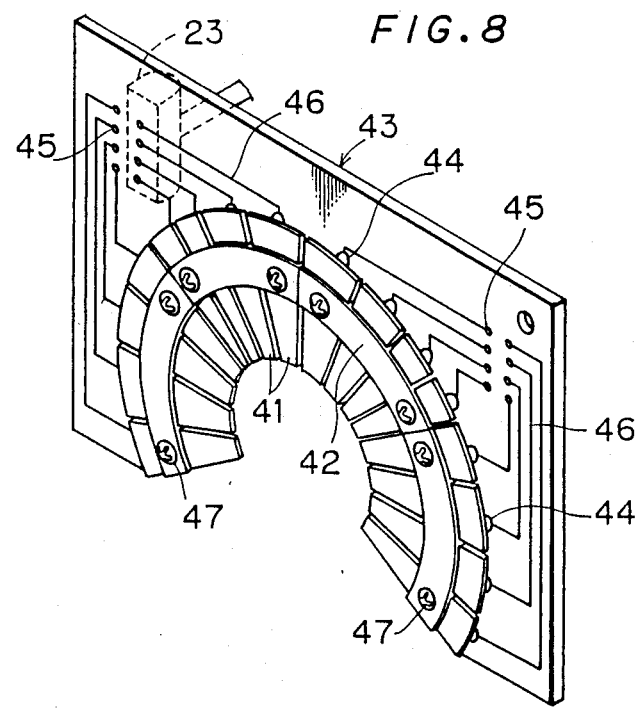
FIG. 8 is a perspective view illustrating movable terminals 41 shown in FIG. 7.

FIGS. 7 and 8 show the third embodiment of the present invention. Referring to FIGS. 7 and 8, parts corresponding to those shown in FIGS. 1 and 2 are denoted by the same reference numerals, and redundant description is omitted.

According to this embodiment, movable terminals 41 are formed of strip-shaped metal plate springs having surfaces plated with a conductive metal, and fixed to a printed circuit board 43. Groups of, e.g., four such movable terminals 41 are held by terminal blocks 42 of resin, while conductive contact pins 44 are fixed to the printed circuit board 43 and connected with through holes 45 by pattern wires 46. The terminal blocks 42 are fixed to the printed circuit board 43 with screws 47 to bring the outer peripheral portions of the movable terminals 41 into pressure contact with the contact pins 44, thereby electrically connecting the movable terminals 41 with the contact pins 44. The through holes 45 can be connected with connectors 23, similarly to the first embodiment. In order to provide a moving operation to the movable terminals 41, the inner peripheral end portions thereof may be distorted by a hook 24, similarly to the first embodiment.

According to this embodiment, the movable terminals 41 formed of metal plate springs have extremely superior durability to those of the first and second embodiments. It is also easy to replace only the movable terminals 41 rather than the whole printed circuit board. If layers of plating on of the movable terminals 41 become abraded at surfaces where they contact the chip electronic components 6, the movable terminals 41 may be simply turned over for re-employment. In this case,, the plate, springs are not necessarily restricted to being made of metal, but may be prepared from other materials as long as the plate springs have conductive surfaces.

Figure 9:
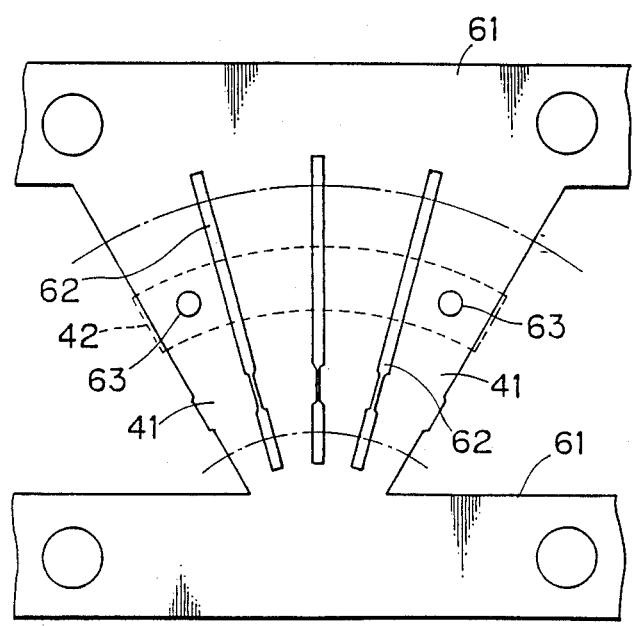
FIG. 9 is an enlarged front elevational view showing a metal plate which is prepared for obtaining the movable terminals 41 shown in FIG. 8.

Preferably the movable terminals 41 are manufactured in the following manner: As shown in FIG. 9, each group of four movable terminals 41 are pressed from a metal plate and are coupled with each other by a lead frame 61, to define slits 62 between the movable terminals 41. These slits 62 are narrowed at portions thereof along the loci of movement of the chip electronic components 6, thereby preventing the chip electronic components 6 from falling from the turn table 4 or being caught by the slits 62. Then each terminal block 42 is resin-molded as shown in broken lines at the FIG. 9, and this structure is cut in positions shown in one-dot chain lines. Holes 63 for receiving the screws 47 are defined in the movable terminals 41 located on both ends of this structure and corresponding portions of the terminal block 42.

According to this embodiment, four terminal blocks 42 are fixed to the printed circuit board 43 to provide 16 movable terminals 41. However, the number of such terminal blocks 42 mounted on the printed circuit board 43 can be appropriately varied with the number of the terminals 41 which are mounted on each terminal block 42. Further, the number of the terminals 41 themselves can be appropriately changed in response to the number of the characteristics to be measured.

The movable terminals 41 can be elastically brought into contact with electrodes 6b which are provided on corresponding ends of the chip electronic components 6 held in the holding holes 5 of the turn table 4, to press electrodes 6a which are provided on the other ends of the chip electronic components 6 against the fixed terminals 11 through such contact pressure.

If the movable terminals 41 are insufficient in spring force, a reinforcing spring member 48 may be fixed to a spacer 15, to support back portions of the movable terminals 41 by insulating projections 48a which are provided on the forward end portion of the spring member 48.

Figure 10:
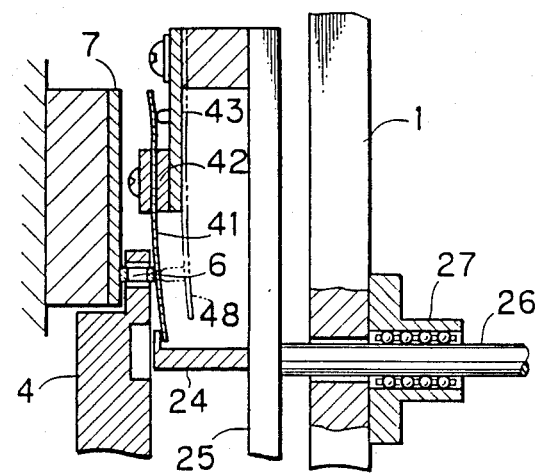
FIG. 10 is a side elevational view showing a principal part of the fourth embodiment of the present invention.
Figure 11:
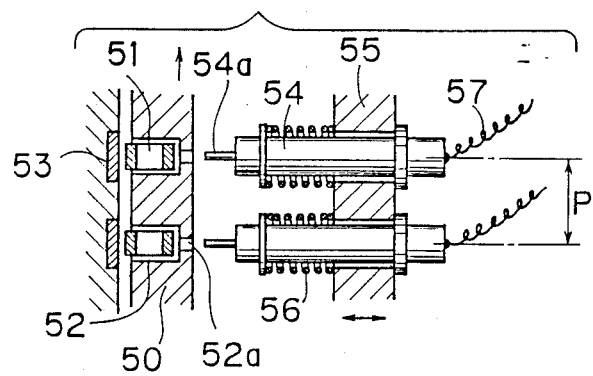
FIG. 11 is a sectional view showing a conventional apparatus for measuring characteristics of chip electronic components.

FIG. 10 shows the fourth embodiment of the present invention. Referring to FIG. 10, parts corresponding to those shown in FIG. 7 are denoted by the same reference numerals, and redundant description is omitted.

This embodiment is adapted to move the overall printed circuit board 43 including movable terminals 41, in order to approach/separate the movable terminals 41 to/from chip electronic components 6, similarly to the second embodiment. In this case, not only a hook 24 but the printed circuit board 43, supporting the movable terminals 41, is fixed to a hook mounting plate 25, so that the hook 24 slightly distorts the inner peripheral edge portions of the movable terminals 41. Also in this case, a plate spring 48 may be arranged at the back of the movable terminals 41 if necessary, in order to compensate for insufficient elasticity of the movable terminals 41. Similarly to the second embodiment, the hook 24 is not requisite in this embodiment.

According to this embodiment, the movable terminals 41 can be reduced in amount of distortion as compared with the third embodiment, whereby the movable terminals 41 can be improved in durability.

As to the third and fourth embodiments, the following modifications are also available:

For example, the movable terminals 41 may not be held by the terminal blocks 42 to be fixed to the printed circuit board 43, but may be directly mounted on a support plate such as the printed circuit board.

The contact pins 44 provided on the printed circuit board 43 may be replaced by electrodes which are formed by printing or the like. In this case, the movable terminals 41 can be directly connected/fixed to the electrodes by solder or the like.

The measuring terminals may be connected with the measuring devices not through the pattern wires provided on the printed circuit board but directly through lead wires or the like.

The means for holding the measuring terminals is not restricted to the printed circuit board.

The plate springs forming the movable terminals are not restricted to being made of metal as long as the same have at least conductive surfaces.

The movable terminals are not necessarily arcuately arranged on the means for holding the same, but may be linearly arranged. In this case, the means for holding the movable terminals must be of a linear movement type. This also applies to the first and second embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for measuring electric characteristics of chip electronic components having first and second electrodes provided on first and second opposite end surfaces respectively, said apparatus comprising:

a movable holding member provided with a plurality of holding holes arranged at constant pitches for receiving said chip electronic components through said holes so that first and second end portions thereof including said first and second end surfaces of said chip electronic components project therefrom respectively and said holding holes being arranged along the direction of movement of said holding member;

a plurality of fixed terminals planarly arranged in correspondence to said holding holes of said movable holding member and capable of being in contact with said first end surfaces of said chip electronic components held in said holding holes; and a plurality of movable terminals arranged to oppose said fixed terminals and separated therefrom by said movable holding member, said movable terminals being formed at least partially of an elastically flexible plate member and being disposed for being elastically in contact with said second end surfaces of said chip electronic components held in said holding holes.

2. An apparatus in accordance with claim 1, further comprising means for moving said movable terminals toward and away from said second end surfaces of said chip electronic components.

3. An apparatus in accordance with claim 2, wherein said mans for moving said movable terminals toward and away form said second end surfaces of said chip electronic components includes means for flexing said elastically flexible plate member of said movable terminals.

4. An apparatus in accordance with claim 2, wherein said means for moving said movable terminals toward and away from said second end surfaces of said chip electronic components includes means for displacing the entire said movable terminals.

5. An apparatus in accordance with claim 1, further comprising spring means for elastically pressing said movable terminals toward said movable holding member.

6. An apparatus in accordance with claim 1, wherein said movable terminals are formed from a plate member, which is provided with a plurality of terminal parts arranged at constant pitches and slits defined between said terminal parts.

7. An apparatus in accordance with claim 6, wherein said plate member is a printed circuit board having pattern wires connected to external connection terminals, and said terminal parts are electrically connected with said external connection terminals through said pattern wires.

8. An apparatus in accordance with claim 1, wherein said movable terminals are formed of plate springs having first ends fixed to a plate member.

9. An apparatus in accordance with claim 8, wherein said plate member is a printed circuit board having a contact part which is in contact with said plate springs, and pattern wires which are connected to external connection terminals, and said plate springs are electrically connected with said external connection terminals through said contact part and said pattern wires.

10. An apparatus in accordance with claim 1, wherein said movable holding member is a rotatable turn table, and said holding holes are arranged along the circumferential direction of said turn table.

11. An apparatus in accordance with claim 5, wherein said spring means presses upon a surface of said movable terminal which is opposite to the surface which faces said movable holding member.

* * * * *